United States Patent
Graffel et al.

(10) Patent No.: US 12,005,516 B2
(45) Date of Patent: Jun. 11, 2024

(54) METHOD FOR SMOOTHING A COMPONENT SURFACE REGION

(71) Applicant: Fraunhofer-Gesellschaft zur Förderung der angewandten Forschung E.V., Munich (DE)

(72) Inventors: Benjamin Graffel, Dresden (DE); Falk Winckler, Dresden (DE); Sven Fritzche, Dresden (DE); Bernd Kieback, Dresden (DE); Burghardt Klöden, Dresden (DE); Thomas Weissgärber, Dresden (DE)

(73) Assignee: Fraunhofer-Gesellschaft zur Förderung der angewandten Forschung E.V., Munich (DE)

( * ) Notice: Subject to any disclaimer, the term of this patent is extended or adjusted under 35 U.S.C. 154(b) by 769 days.

(21) Appl. No.: 17/270,614

(22) PCT Filed: Sep. 13, 2019

(86) PCT No.: PCT/EP2019/074525
§ 371 (c)(1),
(2) Date: Feb. 23, 2021

(87) PCT Pub. No.: WO2020/053407
PCT Pub. Date: Mar. 19, 2020

(65) Prior Publication Data
US 2021/0197307 A1  Jul. 1, 2021

(30) Foreign Application Priority Data
Sep. 14, 2018  (DE) .................... 10 2018 122 605.5

(51) Int. Cl.
*B23K 15/08*  (2006.01)
*B23K 15/00*  (2006.01)

(52) U.S. Cl.
CPC .......... *B23K 15/08* (2013.01); *B23K 15/0013* (2013.01)

(58) Field of Classification Search
CPC . B23K 15/0013; B23K 15/08; H01J 37/3005; H01J 37/304
(Continued)

(56) References Cited

U.S. PATENT DOCUMENTS

| 2015/0037601 | A1* | 2/2015 | Blackmore | .......... B23K 15/002 219/76.1 |
| 2017/0355147 | A1* | 12/2017 | Buller | .................... B23K 26/36 |
| 2018/0117851 | A1* | 5/2018 | Reese | ................... B29C 64/209 |

FOREIGN PATENT DOCUMENTS

| DE | 2654486 A1 | 6/1977 |
| DE | 3905551 A1 | 8/1990 |

(Continued)

OTHER PUBLICATIONS

Office Action dated Nov. 22, 2023 for German Patent Application No. 10 2018 122 605.5 (9 pp.), note: pp. 1 and 2 are English language Explanation to Section C. Result of Determination Document.
(Continued)

*Primary Examiner* — Dana Ross
*Assistant Examiner* — Joseph W Iskra
(74) *Attorney, Agent, or Firm* — Crowell & Moring LLP

(57) ABSTRACT

A method is provided for smoothing a surface region of a component consisting of an electrically conductive material. The surface region of the component is coated inside a vacuum chamber, by focused electron beam(s) with a first surface energy, which brings about melting of the component material within the surface region. Before melting, the surface region is passed over at least twice by the electron beam, each time with a different focal length of the electron
(Continued)

beam. A second surface energy is set for the electron beam, such that no melting of the component material is brought about in the surface region. Data is recorded by a number of sensors arranged inside the vacuum chamber. An actual value for the roughness is compared to a set point value. If the actual value has not reached the set point value, a value for the first surface energy is determined via comparison.

5 Claims, 4 Drawing Sheets

(58) Field of Classification Search
USPC .................................................. 219/121.17
See application file for complete search history.

(56) References Cited

FOREIGN PATENT DOCUMENTS

DE    10 2006 032 303 A1    1/2008
WO    WO 1996/31315 A1    10/1996

OTHER PUBLICATIONS

International Search Report for Patent Application No. PCT/EP2019/074525, dated Jan. 3, 2020, 4 pgs.

\* cited by examiner

METHOD FOR SMOOTHING A COMPONENT SURFACE REGION

CROSS-REFERENCE TO RELATED APPLICATIONS

This application is a 371 nationalization of international patent application PCT/EP2019/074525 filed Sep. 13, 2019, which claims priority under 35 USC § 119 to German Patent Application No. DE 102018122605.5, filed Sep. 14, 2018. The entire contents of each of the above-identified applications are hereby incorporated by reference.

DETAILED DESCRIPTION

Figure 1:
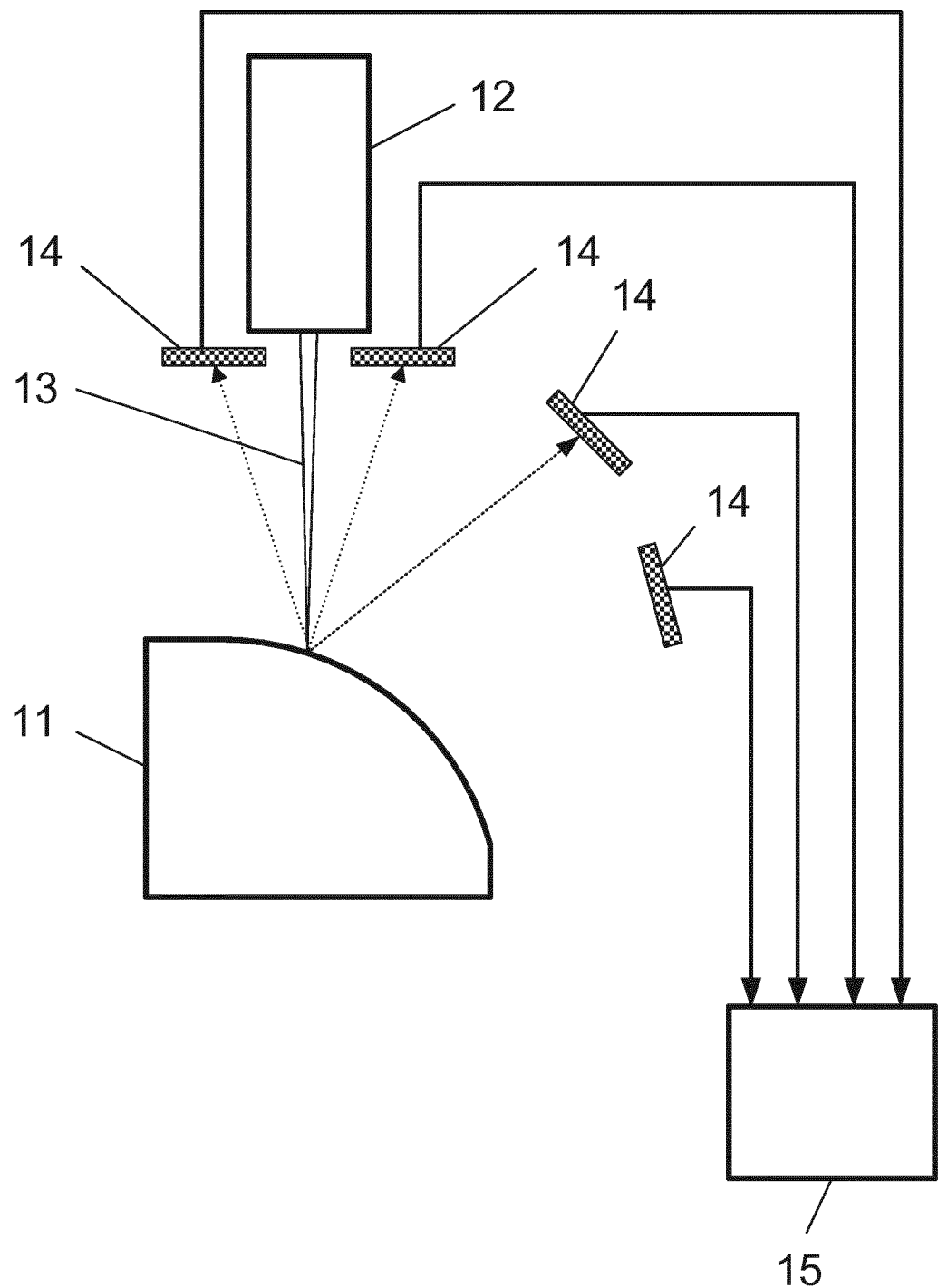
FIG. 1 a schematic representation of a device to execute the method according to the invention.

The invention relates to a method for smoothing component surfaces that consist of an electrically conductive material.

The manufacturing of components with so-called additive manufacturing is increasingly gaining in significance. This involves constructing a component in layers by locally fusing powders using a laser or electron beam. Components manufactured this way can have very complex internal structures such as surfaces with complicated shapes (freeform surfaces) that can frequently not be manufactured in this form with traditional, subtractive methods. These methods unlock completely new application and design capabilities, in particular for lightweight construction in aerospace and medical device engineering.

US 2015/0037601 proposes building a 3D component in layers by fusing a powder layer one after the other, layered on top of each other using an energy beam. After a powder layer is fused, the surface structure of the 3D component realized up to that point is scanned with an electron beam, and an analysis of the backscatter electrons determines whether the previously achieved surface structure already meets the target specification. If this is not the case, the next powder layer is fused.

But a particular disadvantage of additively manufactured components is the particularly rough surface after the manufacturing process. Rough surfaces are created with this manufacturing method because the layered growth process in the powder bed is also additionally accompanied by adhesion of not completely fused powder particles. The rough surfaces of additively manufactured components have until now rendered their use difficult.

A known approach to reduce the surface roughness of additively manufactured components includes the use of finer powers, which however reduces the speed and therefore the productivity of the manufacturing process. Smoothing the surfaces of additively manufactured components with material removing mechanical methods is frequently not possible on the highly detailed freeform surface structure of a component.

On alternative methods for smoothing surfaces, the surface of a component is partially or completely fused or vaporized using a laser or electron beam. In WO 1996/31315 A1 for example, smoothing or polishing of a component surface is achieved by initially scanning the component surface with a contour measurement device to record the actual state of the component shape. The actual state is then compared with a target state and a signal is then formed depending on the comparison result, wherein the signal is used to control a laser beam for fusing the component surface. This method proposes optical systems using a laser or mechanical scanning to scan the component surface.

DE 2654486 A1 discloses a method on which the rough surface of a punched needle eyelet is fused and thus smoothed by irradiation with an electron beam or a laser. The document thereby demonstrates the basic effectiveness of surface smoothing with local fusing. But the method does not permit locally adapted smoothing of arbitrary, three-dimensional bodies with complex shapes. In particular, the surface profile and surface roughness are not recorded.

When processing components with complex shapes and/or when employing locally different processing methods on a surface, the radiation parameters need to be specifically adjusted for the momentarily processed surface area in relation to the intended processing result. An example for adjusting the laser radiation intensity when hardening crankshafts is described in DE 3905551 A1. The laser beam and the workpiece are in this case moved relative to each other, and the laser intensity is modulated as a function of the surface geometry scanned by the laser beam and the desired penetration depth. In addition to hardening, a smoothing of the surface areas is possible in this way. The speed of the relative motion is in this case controlled by contactless measurement of the surface temperature. But the method does not disclose a capability to detect the contour and roughness of a freeform surface having a complicated shape.

The invention is therefore based on the technical task to create a method for smoothing component surfaces by which the disadvantages of the prior art can be overcome. In particular, the method according to the invention is also intended to record the actual status of the component surface roughness and to derive technical parameters for smoothing the component surface based on the actual status.

The method according to the invention for smoothing a surface region of a component that consists of an electrically conductive material at least within the surface region involves fusing the surface region of the component in a vacuum chamber using at least one focused electron beam. The surface region is fused by scanning the surface region with the electron beam with a first surface energy that causes the surface region to fuse. Surface energy is defined as the energy per area that is introduced by the electron beam into the component to be processed by the electron beam. The surface energy depends on the dwell time of the electron beam within the surface region and on the intensity of the electron beam.

Scanning an electron beam over a component surface region with a second surface energy is hereinafter also abbreviated as scanning the surface region.

But before the surface region of the component is fused with the electron beam, the method according to the invention first involves determining an actual state of the roughness within the surface region and comparing the latter with a target state of the roughness within the surface region.

For this purpose, the electron beam performs two scans of the surface region prior to fusing, but with a second surface energy that does not cause the component material to fuse in the surface region. What surface energy does and does not cause the surface region of a component to fuse depends on the material and the component shape, but can be easily determined in laboratory tests. It is essential for the invention that the electron beam performs at least two scans of the surface region with the electron beam using the second surface energy, in each case with a different focal length of the electron beam.

A plurality of sensors is arranged within the vacuum chamber in which the component is processed by the electron beam. These sensors are distributed within the vacuum chamber and are arranged above the surface region to be processed by the electron beam such that backscatter electrons of the electron beam and secondary electrons dislodged from the material of the component can impact the sensors. While the surface region is scanned by the electron beam with the second surface energy, the sensors are then used to record data that characterize the electrical current generated by the backscatter electrons and secondary electrons impacting the sensors. The recorded data can for instance comprise data that characterize the current at a respective sensor caused by the backscatter electrons and secondary electrons impacting the sensor.

The data recorded by the sensors are transmitted to an analysis device by means of which an actual value is determined for the roughness within the surface region.

Because the paths of the electrons from the electron beam and the paths of the backscatter electrons reflected by the surface predominantly behave according to the optical law "angle of incidence equals angle of reflection", the backscatter electrons are reflected in various directions when the surface is rough as the surface region is scanned with the second surface energy, and the backscatter electrons are therefore also recorded by several sensors in various positions. The higher the number of sensors arranged within the vacuum chamber that record the impact of backscatter electrons as the surface region is scanned with the electron beam with the second surface energy, the rougher the surface is within the surface region. But when only few sensors or even only one sensor indicates the impact of backscatter electrons or the current recorded by the sensors has a peak on one sensor or on very few sensors, the roughness within the surface region is low. Based on this approach, the data recorded by the sensors can be used for an assessment regarding the current roughness or an actual value can be determined for the roughness within the surface region. The larger the number of the sensors arranged in the vacuum chamber, the more precise an assessment can be derived regarding the roughness within the surface region. When several sensors are used, these can also be arranged in the form of a sensor array. But qualitative assessments regarding the roughness within the surface region can already be derived with at least two sensors.

In order to record backscatter electrons and secondary electrons with the sensors that must be located outside of the beam region of the electron beam at good resolution as a function of surface roughness, it is advantageous when an angle of incidence of the electron beam onto the surface of the processed component is selected that is less than 90°. An angle of incidence of the electron beam onto the surface of the processed component is preferably selected in a range from 45° to 90°.

As described above, the method according to the invention scans a surface region at least twice using an electron beam with the second surface energy, wherein a different focal length of the electron beam is adjusted in each case. It has been shown that a more precise assessment of the roughness within the surface region can be derived when the surface region is scanned multiple times with different focal lengths and the data recorded by the sensors for one pass is linked within the analysis device with the data of the subsequent pass and/or with the data of subsequent passes using a mathematical operation, and an actual value for the roughness is derived from the linked results. The data of the successive passes can for example be added.

Once the data transmitted by the sensors for the successive passes are processed by the analysis device into an actual value for the roughness within the surface region, this actual value for the roughness within the surface region is compared with a target value for the roughness within the surface region. As a function of the comparison result, a value for the first surface energy is then determined by the analysis device. The electron beam then scans the surface region of the component with said first surface energy in order to fuse the surface region for purposes of smoothing. This involves taking into account the following relationship. The less the actual value for the roughness within the surface region deviates from the target value for the roughness within the surface region, the lower the set value for the first surface energy. Conversely, this means that the rougher the surface region still is, the higher the set value for the first surface energy must be, and the deeper the surface region is fused with the first surface energy by means of the electron beam.

After the surface region is fused with the first surface energy using the electron beam, the surface region is again scanned at least twice with the second surface energy using the electron beam, wherein at least two scanning operations are again in each case performed with a different focal length of the electron beam. The previously described recording of data with the sensors, transmitting the data to the analysis device, determining a current actual value for the roughness in the surface region, comparing the actual value for the roughness within the surface region with the target value for the roughness within the surface region, and setting the value for the first surface energy as a function of the comparison result are performed. The described feedback loop of scanning the surface region followed by fusing the surface region is repeated until the actual value for the roughness within the surface region has reached the target value for the roughness within the surface region.

With each fusing operation of the surface region, the roughness within the surface region declines, so that a lower value for the first surface energy can be set for a subsequent fusing operation, causing the surface region to be fused at only a lower depth in the subsequent fusing operation. The iterative fusing of the surface region with increasingly reduced fusing depth ultimately results in smoothing the surface within the surface region.

In an embodiment, the data recorded by the sensors are used by the analysis device to generate a three-dimensional representation of the surface region.

When the surface region of the component that is scanned with the electron beam is not a planar surface but instead has non-planar features due to the component shape, this has the effect that the three-dimensional representation generated within the analysis device based on the data recorded with the sensors during the one-time scanning using a focal length exhibits partial surface regions where the three-dimensional representation has high detail sharpness and partial surface regions where the three-dimensional representation only has low detail sharpness. According to the invention, a surface region is therefore also scanned at least twice, in each case with a different focal length of the electron beam. It has been shown that when a surface region is scanned with the electron beam at different focal lengths, other partial surface regions are in each case rendered with high detail sharpness on the three-dimensionally generated representation.

In a further embodiment of the invention, the data recorded by the sensors during each scan of a surface region of a component with an electron beam are transmitted to an analysis device, a three-dimensional representation of the surface region is then generated with the analysis device, and the partial surface regions rendered with high detail sharpness are cut out of the three-dimensional representation using known graphics software, wherein the different partial surface regions with high detail sharpness obtained in this manner for each scan with a different focal length of the electron beam are then reassembled into an overall representation of the surface. Based on this approach, a three-dimensional composite representation of the surface region can be generated with high detail sharpness. The more frequently a surface region is scanned with a different focal length of the electron beam, the more accurately the details of a three-dimensional representation of the surface region can be calculated with the analysis device.

The data recorded by the sensors and/or the three-dimensional composite representation of the surface region with high detail sharpness can then be used to derive information about the surface shape within the surface region for aligning the surface region in relation to the angle of incidence of the electron beam and to derive an actual value of the roughness within the surface region.

Optionally, the component to be processed with an electron beam can be arranged within the vacuum chamber using a holding device that can change the position of the component within the vacuum chamber in three dimensions. After arranging the component within the vacuum chamber using the holding device, a surface region of the component is scanned by the electron beam at least twice at different focal lengths. The resulting data recorded by the sensors is then used within the analysis device to create a three-dimensional representation of the surface region, the three-dimensional representation is then used to make an assessment of the actual three-dimensional orientation of the component within the vacuum chamber, which is then compared with a target orientation of the component. Depending on the comparison result, a signal is then formed based on which the holding device guides the component to the target orientation within the vacuum chamber.

Using this approach, it is then for example possible to bring the component into a desired starting position within the vacuum chamber for processing with the electron beam, or to also change the orientation of the component and to inspect the current spatial arrangement of the component after its orientation was changed when the component needs to be transferred into another position after a surface region has been processed in order to process another surface region.

The present invention is explained in detail as follows based on exemplary embodiments.

FIG. 1 is a schematic representation of a device by means of which the method according to the invention can be executed. A component 11 that is for example fabricated using additive manufacturing and consisting of an electrically conductive material, and that has a constant cross-section according to FIG. 1, and that extends in the depth of the drawing plane in FIG. 1 in relation to its length extent, has a convex surface shape on one side. Because the convex surface shape has excessive roughness, this surface is to be smoothed. According to the invention, the component 11 is for this purpose placed into a vacuum chamber. At least one electron beam generator 12 is arranged in the vacuum chamber or mounted on the vacuum chamber, wherein the electron beam generator 12 is used to generate a deflectable, focused electron beam 13 that can be used to scan the convex surface shape of the component 11. A plurality of sensors 14 are arranged within the vacuum chamber above the convex surface shape of the component 11 such that electrons that are reflected on component 11 or dislodged as secondary electrons from the component 11 as the electron beam 13 impacts the convex surface shape of the component 11 can impact the sensors 14. The exemplary embodiment according to FIG. 1 only shows four sensors 14 for illustration purposes.

According to the invention, the surface region of component 11 to be smoothed is scanned once in a first step. This means that the surface region to be smoothed is scanned with the electron beam 13, wherein the surface energy introduced into the component 11 by the electron beam 13 is set such that scanning the component 11 with the electron beam 13 does not cause the component material to fuse. The surface energy set for scanning is also referred to as the second surface energy. The component surface region is preferably scanned with the electron beam in a linear shape. Alternatively, other geometric shapes and patterns can however also be described with the electron beam when scanning the surface region to the smoothed. In the exemplary embodiment according to FIG. 1, the convex surface region shape to be smoothed is scanned in a linear shape, wherein the lines drawn by the electron beam 13 extend along the length extent of the component 11, for example in the depth of the drawing plane.

The linear scanning of the surface region of component 11 to be smoothed is achieved by changing the deflection angle of the electron beam 13 from line to line. As a function of the deflection angle of the electron beam and of the roughness of the surface region to be smoothed, backscatter and secondary electrons impact different sensors 14 and/or a different number of sensors 14, and generate a current flow on these. Data that characterize the electrical current on the sensors 14 caused by the backscatter and secondary electrons are forwarded from the sensors 14 to an analysis device 15. The analysis device 15 is preferably located outside of the vacuum chamber. The greater the number of sensors 14 that record an electrical current flow as the electron beam 13 describes a line, the rougher the surface of component 13 scanned with the electron beam. Conversely, the conclusion can be drawn that the lower the number of sensors that record an electrical current flow and/or the greater the electrical current flow is for an individual sensor 14 in relation to other sensors 14, the smoother the surface of component 11 scanned with the electron beam 13. When scanning the surface of component 11 with the electron beam 13, the analysis device 15 can then, based on the data transmitted from the sensors 14, make an assessment about the actual value of the roughness in the surface region to be smoothed, and the actual value can then be compared with a target value for the roughness in the surface region to be smoothed.

According to the invention, the convex surface region of the component to be smoothed is scanned at least twice with a different focal length of the electron beam 13, wherein the data transmitted from the sensors 14 for the individual scanning passes are linked together within the analysis device using a mathematical operation. It has been shown that multiple scans of a surface region with different focal lengths of the electron beam and linking the resulting data results in more accurate assessments about the actual value of the roughness in the scanned the surface region, compared to when the surface region is only scanned once.

After the surface region of component 11 to be smoothed is scanned several times with different focal lengths of the electron beam 13, followed by determining an actual value with the analysis device 15 for the roughness in the surface region to be smooth, and comparing said actual value with a target value for the roughness in the surface region to be smooth, the surface region is smoothed whenever the actual value has not yet reached the target value.

For this purpose, the analysis device calculates a first surface energy as a function of the comparison result, wherein the first surface energy is introduced by the electron beam 13 into the surface region of component 11 to be smoothed, and wherein the surface region is to be fused as a result. The first surface energy is in this case selected the higher the greater the actual value of the roughness in the surface region deviates from the target value. It is known that the surface energy introduced by an electron beam into a component can be increased for example by increasing the beam current of the electron beam and/or by reducing the deflection speed of the electron beam.

After the parameters of the electron beam generator 12 are set such that the calculated first surface energy can be introduced by the electron beam 13 into the component 11, the surface region to be smoothed is again linearly scanned with the electron beam 13, as a result of which the surface region is fused and therefore smoothed.

This is again followed by the procedure described above consisting of at least two scanning passes of the surface region to smoothed, calculating the actual value of the roughness in the surface region to be smooth, comparing the calculated actual value of the roughness to the target value of the roughness, calculating the first surface energy for the electron beam as a function of the comparison result and fusing the surface region to be smoothed. This feedback loop is repeated until the actual value of the roughness in the surface region to be smoothed has reached the target value for the roughness in the surface region to be smoothed.

Figure 2A:
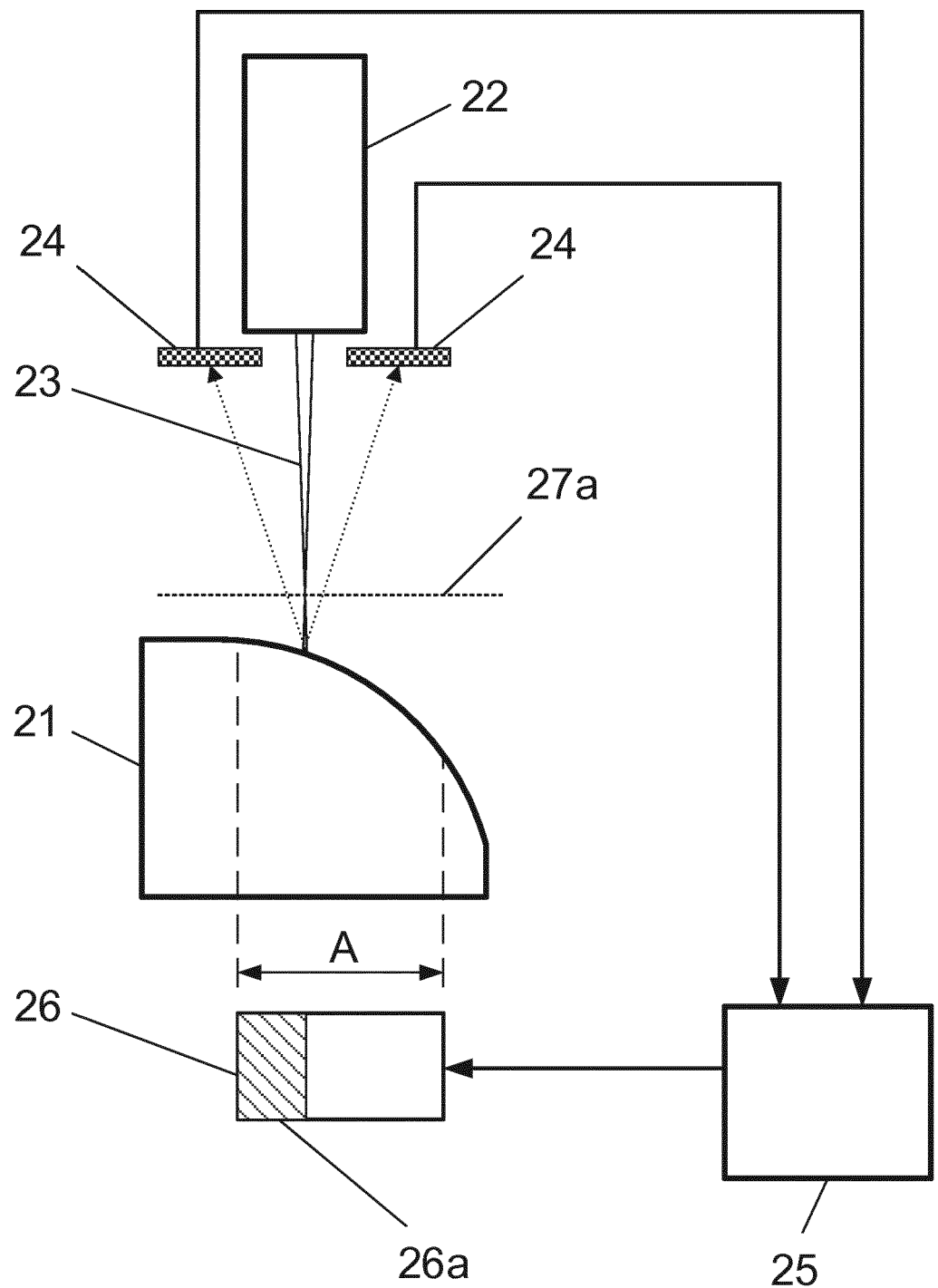
FIG. 2a, 2b, 2c a schematic representation of a device to execute an alternative embodiment of the method according to the invention.
Figure 2B:
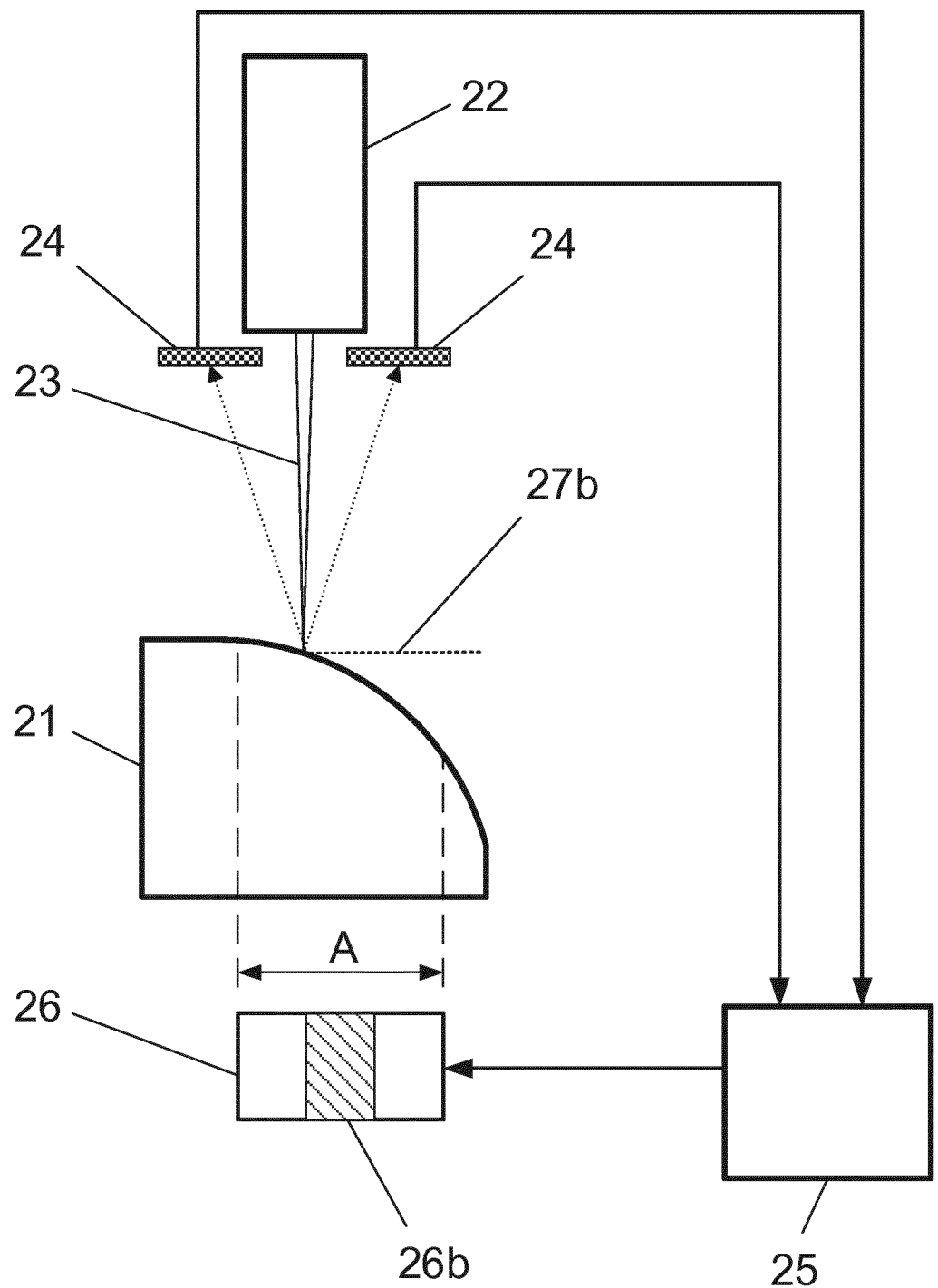
Figure 2C:
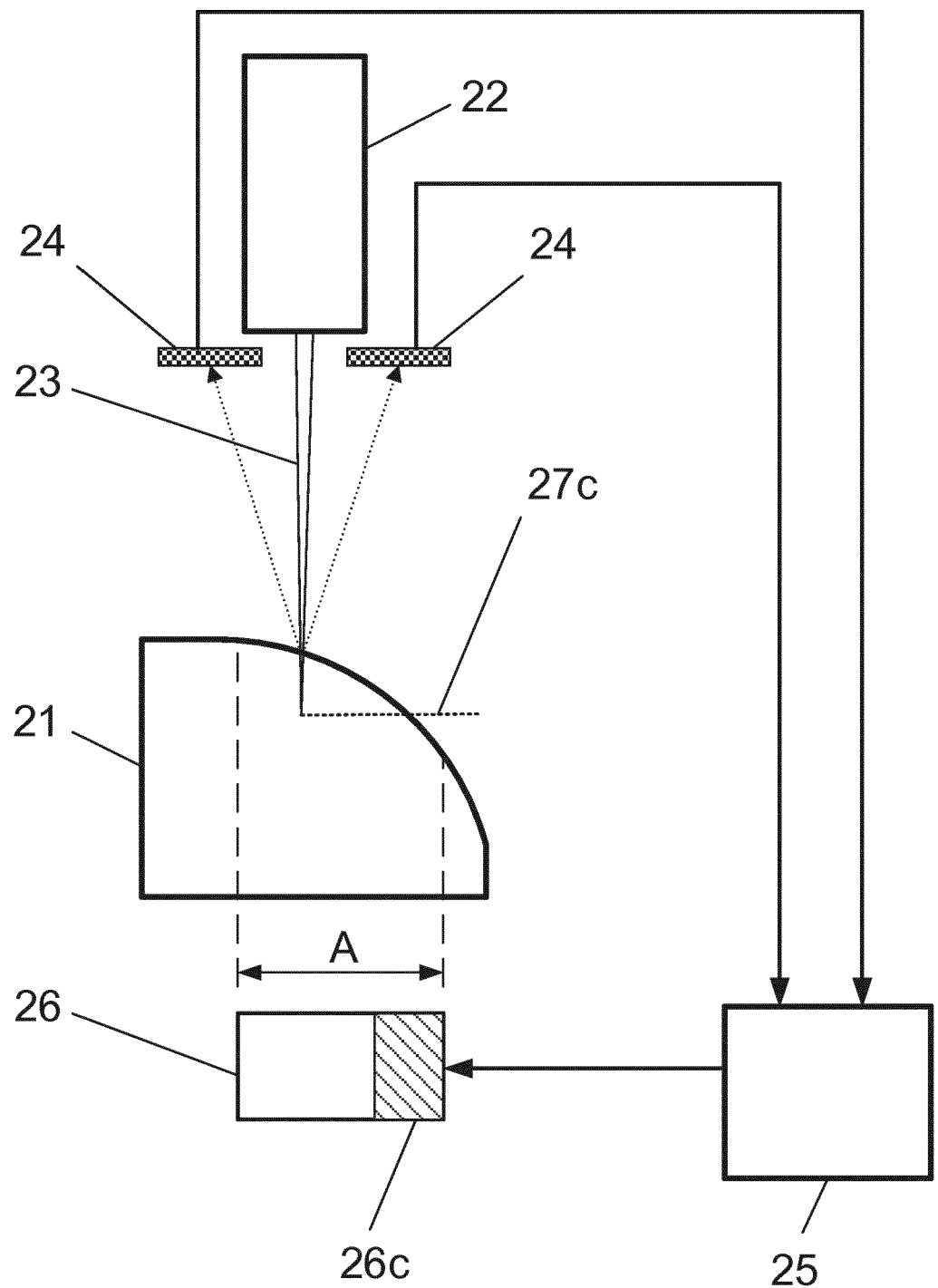

FIGS. 2a, 2b, and 2c show a schematic representation of a device by means of which an alternative embodiment of the method according to the invention can be executed. A component 21 that is for example fabricated using additive manufacturing and consisting of an electrically conductive material, and that has a constant cross-section according to FIGS. 2a, 2b, and 2c, and that extends in the depth of the drawing plane in FIG. 2a, 2b, 2c in relation to its length extent, has a convex surface shape on one side. Because the convex surface shape has excessive roughness, this surface is to be smoothed in a surface region with extent A. According to the invention, the component 21 is for this purpose placed into a vacuum chamber. At least one electron beam generator 22 is arranged in the vacuum chamber or mounted on the vacuum chamber, wherein the electron beam generator 22 is used to generate a deflectable, focused electron beam 23 that can be used to scan the convex surface shape in the surface region with extension A. A plurality of sensors 24 are arranged within the vacuum chamber above the convex surface shape of the component 21 such that electrons can impact the sensors 24 reflecting on component 21 or dislodged as secondary electrons from the component 21 as the electron beam 23 on the convex surface of the component 21. The exemplary embodiment according to FIG. 2a, 2b, 2c only shows two sensors 24 for illustration and also for better clarity.

According to the invention, the surface region of component 21 to be smoothed is scanned once in a first step. This means that the surface region to be smoothed is scanned with the electron beam 23 in the extent A, wherein the surface energy introduced into the component 21 by the electron beam 23 is set such that scanning the component 21 with the electron beam 23 does not cause the component material to fuse.

As already described, the surface energy set for scanning is also called the second surface energy. For the exemplary embodiment according to FIGS. 2a, 2b, and 2c, the convex shape of the surface region to be smoothed is also scanned linearly, wherein the lines described by the electron beam 23 extend along the length extent of the component 21, for example in the depth of the drawing plane.

The linear scanning of the surface region of component 21 to be smoothed is achieved by changing the deflection angle of the electron beam 23 from line to line. As a function of the deflection angle of the electron beam and of the roughness of the surface region to be smoothed, backscatter and secondary electrons impact different sensors 24 and/or a different number of sensors 24, and generate a current flow on these. Data that characterize the electrical current on the sensors 24 caused by the backscatter and secondary electrons are forwarded from the sensors 24 to an analysis device 25. The analysis device 25 is located outside of the vacuum chamber.

The analysis device 25 comprises a known graphics software by means of which a three-dimensional representation 26 of the surface region with extent A scanned with the electron beam 23 can be generated using the data transmitted from the sensors 24. FIGS. 2a, 2b, and 2c strictly show a schematic representation as a top view of the three-dimensional representation 26 of the surface region with extent A generated by the analysis device 25.

According to the invention, the surface region with extent A is scanned multiple times with the electron beam 23, wherein a different focal length of the electron beam is selected in each case.

FIG. 2a is a schematic representation of a scanning operation of component 21 for which the focal length of the electron beam 23 is adjusted to a length 27a. The focus of the electron beam 23 in this case has a length that is shorter than the distance from the electron beam generator 22 to the component 21. During this scanning pass, the analysis device 25 generates a three-dimensional representation 26 of the scanned surface region with extent A that strictly has high detail sharpness in the crosshatched partial region 26a.

FIG. 2b is a schematic representation of a scanning operation for which the focal length of the electron beam 23 is adjusted to a length 27b. The focus of the electron beam 23 in this case has a length that is equal to the distance from the electron beam generator 22 to component 21. During this scanning pass, the analysis device 25 generates a three-dimensional representation 26 of the scanned surface region with extent A that strictly has high detail sharpness in the crosshatched partial region 26b.

In a third scanning operation, which is schematically represented in FIG. 2c, the focal length of the electron beam 23 is finally adjusted to a length 27c. The focus of the electron beam 23 in this case has a length that is greater than the distance from the electron beam generator 22 to the component 21. During this scanning pass, the analysis device 25 generates a three-dimensional representation 26 of the scanned surface region with extent A that strictly has high detail sharpness in the crosshatched partial region 26c.

By means of the graphics software of the analysis device 25, the crosshatched partial areas 26a, 26b, 26c with high detail sharpness from the three scanning passes are assembled into a composite representation of the surface region with extent A, thus creating a three-dimensional composite representation of the scanned surface region with high detail sharpness throughout. Such a three-dimensional composite representation can be used to derive information concerning the surface shape and therefore also concerning the actual state of the roughness in the scanned surface region, as well as information concerning the alignment of the scanned surface region in relation to the direction of incidence of the electron beam.

If the three-dimensional composite representation generated by the analysis device 25 was used to determine an actual value for the roughness in the surface region to be smoothed and said actual value was compared to a target value for the roughness in the surface region to be smoothed, the surface region is smoothed whenever the actual value has not yet reached the target value.

For this purpose, the analysis device calculates a first surface energy as a function of the comparison result from the actual value and the target value, wherein said first surface energy is introduced by the electron beam 23 into the surface region of the component 21 to be smoothed, and wherein the surface region is to be fused as a result.

After the parameters of the electron beam generator 22 are set such that the calculated first surface energy can be introduced by the electron beam 23 into the component 21, the surface region to be smoothed is again linearly scanned with the electron beam 23, as a result of which the surface region is fused and thus smoothed.

This is again followed by the procedure described above consisting of at least two scanning passes of the surface region to smoothed, generating a three-dimensional composite representation of the scanned surface region, calculating an actual value of the roughness in the surface region to be smoothed, comparing the calculated actual value of the roughness to the target value of the roughness, calculating the first surface energy for the electron beam as a function of the comparison result and fusing the surface region to be smoothed. This feedback loop is repeated until the actual value of the roughness in the surface region to be smoothed has reached the target value for the roughness in the surface region to be smoothed.

As already described, a three-dimensional composite representation of a scanned surface region generated by the analysis device 25 can also be used to derive the orientation of the scanned surface region in relation to the direction of incidence of the electron beam.

In an embodiment, the component 21 is arranged within the vacuum chamber using a holding device that can change the position of component 21 in three dimensions. After a component surface region of component 21 is scanned multiple times, followed by preparing a three-dimensional representation of the surface region, and determining the orientation of the surface region in relation to the direction of incidence of the electron beam 23, an assessment can also be derived concerning the actual three-dimensional orientation of component 21 within the vacuum chamber, and said actual three-dimensional orientation can then be compared with a target orientation. As a function of the comparison result, the analysis device can then form a signal based on which the holding device guides the component 21 to the target orientation within the vacuum chamber.

Based on this approach it is then for example possible to bring the component 21 into a desired starting position within the vacuum chamber for processing with the electron beam 23, or also to change the orientation of component 21 and to then verify the current spatial arrangement of component 21 after the change of orientation if the component 21 is to be brought into another position for the purpose of processing another surface region after a surface region has been processed.

Alternatively, or additionally, it is also possible to arrange the electron beam generator 22 within the chamber with a holding device that can change in three dimensions, and control and/or adjust the position of the electron beam generator 22 in relation to component 21 by means of the method according to the invention.

To clarify the use of and to hereby provide notice to the public, the phrases "at least one of <A>, <B>, . . . and <N>" or "at least one of <A>, <B>, . . . or <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

The invention claimed is:

1. A method for smoothing a surface region on a component that consists of an electrically conductive material at least within the surface region, the method comprising:
   scanning the surface region of the component within a vacuum chamber by at least one focused electron beam with a first surface energy that causes the component material within the surface region to fuse;
   scanning the surface area prior to fusing at least twice by the at least one electron beam, in each case with a different focal length of the at least one electron beam;
   setting a second surface energy for the at least one electron beam that does not cause the component material in the surface region to fuse;
   recording data by a plurality of sensors arranged within the vacuum chamber, the data characterizing the electrical current caused by backscatter electrons impacting the sensors;
   deriving, with an analysis device, an actual value for the roughness within the surface region from the data recorded by the sensors, wherein the actual value for the roughness is compared with a target value for the roughness, and a value for the first surface energy is determined as a function of the comparison result when the actual value for the roughness has not reached the target value for the roughness; and
   scanning the surface region thereafter by the at least one electron beam with the first surface energy, whereupon the method is continued with the scanning the surface area prior to fusing.

2. The method of claim 1, wherein the at least one electron beam is directed toward the surface region of the component at an angle less than 90°.

3. The method of claim 2, wherein the at least one electron beam is directed toward the surface region of the component at an angle in the range of 45° to 90°.

4. The method of claim 3, wherein the component is arranged within the vacuum chamber using a holding device that can change the component position within the vacuum chamber in three dimensions.

5. The method of claim 4, wherein after the component is arranged in the vacuum chamber using the holding device,
- the component is scanned by the at least one electron beam;
- deriving an assessment of the actual three-dimensional orientation of the component within the vacuum chamber from the data recorded by the sensors within the analysis device, and the actual three-dimensional orientation is compared with a target orientation of the component; and
- generating, as a function of the comparison result, a signal with which the holding device guides the component to the target orientation within the vacuum chamber.

* * * * *